000
United States Patent
McGrath et al.

(10) Patent No.: US 7,305,646 B2
(45) Date of Patent: Dec. 4, 2007

(54) RELOCATABLE MIXED-SIGNAL FUNCTIONS

(75) Inventors: Donald T. McGrath, Fort Collins, CO (US); Robert D. Waldron, Fort Collins, CO (US); Scott C. Savage, Fort Collins, CO (US); Kenneth G. Richardson, Erie, CO (US)

(73) Assignee: LSI Corporation, Milpitas, CA (US)

( * ) Notice: Subject to any disclaimer, the term of this patent is extended or adjusted under 35 U.S.C. 154(b) by 281 days.

(21) Appl. No.: 11/125,307

(22) Filed: May 9, 2005

(65) Prior Publication Data
US 2006/0253825 A1   Nov. 9, 2006

(51) Int. Cl.
*G06F 17/50* (2006.01)
*H03K 19/173* (2006.01)
(52) U.S. Cl. .............................. 716/12; 716/1; 326/38
(58) Field of Classification Search ................ 716/1, 716/8, 12; 326/38
See application file for complete search history.

(56) References Cited

U.S. PATENT DOCUMENTS

| | | | |
|---|---|---|---|
| 6,028,990 A * | 2/2000 | Shahani et al. ................. 716/8 |
| 6,617,621 B1 * | 9/2003 | Gheewala et al. .......... 257/207 |
| 7,185,301 B2 * | 2/2007 | Hao et al. ....................... 716/8 |
| 2005/0034094 A1 * | 2/2005 | Madurawe .................... 716/12 |
| 2005/0099864 A1 * | 5/2005 | Brown et al. ................ 365/202 |
| 2005/0119549 A1 * | 6/2005 | Markas et al. .............. 600/407 |
| 2005/0257177 A1 * | 11/2005 | Chen et al. ..................... 716/1 |

* cited by examiner

*Primary Examiner*—Vuthe Siek
*Assistant Examiner*—Magid Y. Dimyan
(74) *Attorney, Agent, or Firm*—Christopher P Maiorana PC

(57) ABSTRACT

An apparatus that may include a base layer of a platform application specific integrated circuit (ASIC) and a mixed-signal function. The base layer of the platform application specific integrated circuit (ASIC) generally comprises a plurality of pre-diffused regions disposed around a periphery of the platform ASIC. Each of the pre-diffused regions may be configured to be metal-programmable. The mixed-signal function may include two or more sub-functions formed with a metal mask set placed over a number of the plurality of pre-diffused regions.

20 Claims, 8 Drawing Sheets

RELOCATABLE MIXED-SIGNAL FUNCTIONS

FIELD OF THE INVENTION

The present invention relates to platform application specific integrated circuit (platform ASIC) design generally and, more particularly, to a method and/or architecture for implementing relocatable mixed-signal functions.

BACKGROUND OF THE INVENTION

An integrated circuit (IC) design can include support for mixed-signal functions. The term mixed-signal refers to functions involving both digital and analog signals. In platform application specific integrated circuits (platform ASICs), custom diffused mixed-signal areas are placed on metal mask programmable platforms to support a mixed-signal function. However, if the mixed-signal function is not used, the custom diffused area is wasted.

It would be desirable to have an architecture and/or method that supports relocatable mixed-signal functions without potentially wasted area.

SUMMARY OF THE INVENTION

The present invention concerns an apparatus that may include a base layer of a platform application specific integrated circuit (ASIC) and a mixed-signal function. The base layer of the platform application specific integrated circuit (ASIC) generally comprises a plurality of pre-diffused regions disposed around a periphery of the platform ASIC. Each of the pre-diffused regions may be configured to be metal-programmable. The mixed-signal function may include two or more sub-functions formed with a metal mask set placed over a number of the plurality of pre-diffused regions.

The objects, features and advantages of the present invention include providing relocatable mixed-signal functions that may (i) be formed using a metal mask set, (ii) be formed using a number of pre-diffused regions of a platform ASIC, (iii) comprise two or more sub-functions implemented in two or more I/O slots, (iv) provide mixed-signal functions in areas conventionally used for digital circuitry, (v) allow relocatable placement of mixed-signal functions and/or (vi) be placed anywhere around a chip.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
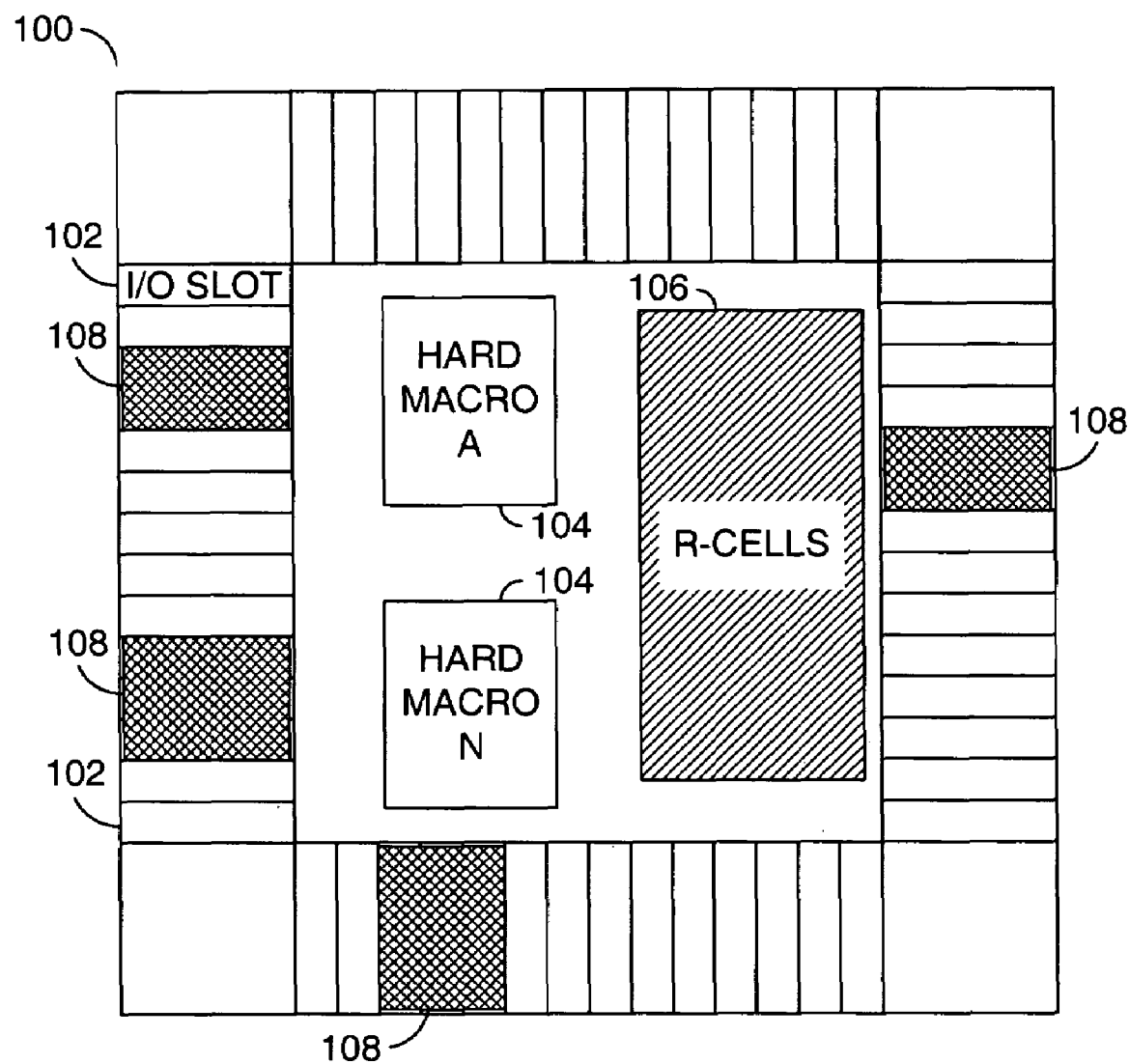
FIG. 1 is a block diagram illustrating a platform application specific integrated circuit (ASIC) in accordance with one or more preferred embodiments of the present invention.

Referring to FIG. 1, a block diagram of a programmable platform device (or die, or slice) 100 is shown in accordance with one or more preferred embodiments of the present invention. The slice 100 may be implemented, in one example, as a partially manufactured semiconductor device (e.g., a platform application specific integrated circuit (platform ASIC)) in which all of the silicon layers (or base layers) have been fabricated (e.g., a first processing or pre-inventory phase), but where customization of the slice 100 may be performed at a later time (e.g., a second processing or completed phase) via one or more metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice may be selected for customization at a later time because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

The slice 100 may comprise a number of pre-diffused regions. In one example, the slice 100 may comprise a plurality of regions 102, a number of regions 104, and one or more regions 106. The plurality of regions 102 may be located around a periphery of the slice 100. The regions 102 may be implemented as configurable I/O slots (or ConfigIOs). For example, each of the regions 102 may be configured to couple a core region of the slice 100 to an I/O pin. The regions 104 may be implemented as one or more hard IP blocks (or hardmacros). The regions 106 may be implemented as one or more diffused regions. In one example, the diffused regions 106 may comprise an R-cell transistor fabric. In another example, the diffused regions 106 may be implemented as a gate array region. The regions 102 may be distributed around a periphery (or edge) of the slice 100. The regions 104 and 106 may be distributed within a core region of the slice 100.

In one example, the regions 104 may be implemented similarly to an ASIC design. In general, the regions 104 may be configured to provide a number of functions on the slice 100. For example, the regions 104 may comprise phase locked loops (PLLs), instances of processors, input/output physical level (PHY) macros, and/or any other type of IP block appropriate to meeting the design criteria of a particular implementation. Soft and firm IP blocks may be implemented in the diffused region(s) 106.

The region 106 may be customized (e.g., by application of one or more metal layers), in one example, as logic and/or memory. For example, the region 106 may be implemented as a sea of gates array. In one example, the region 106 may be implemented as an R-cell transistor fabric comprising a number of R-cells. The term R-cell generally refers to an area of silicon designed (or diffused) to contain one or more transistors that have not yet been personalized (or configured) with metal layers. Wire layers may be added to the R-cells to make particular transistors, logic gates, soft and firm IP blocks and/or storage elements. For example, the programmable R-cells in an R-cell transistor fabric 106 may be customized to build non-diffused memories or other circuits for a particular application.

An R-cell generally comprises one or more diffusions for forming the parts of N and/or P type transistors and the contact points where wires may be attached in subsequent manufacturing steps (e.g., to power, ground, inputs and outputs). In general, the R-cells may be, in one example, building blocks for logic and/or storage elements. R-cells may be diffused in a regular pattern throughout a slice. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors (e.g., N and P, TO, ATO, HP, etc.) may be implemented in each of the regions 102. Some example types and numbers of devices that may be implemented in the regions 102 may be summarized in the following TABLE 1:

TABLE 1

| CONFIGIO2 | | CONFIGIO1 | |
|---|---|---|---|
| Device Type | Number | Device Type | Number |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

However, it will be understood by those skilled in the art that other types and/or numbers of devices may be implemented without departing from the spirit and scope of the present invention.

The devices implemented in the regions 102 may be programmed by defining metal mask sets. In one example, metal-metal capacitors (e.g., approximately one picofarad (pF) per slot) may be formed in the regions 102 where I/O power buses are absent. In one example, more than one of the regions 102 may be combined (e.g., coupled together via routing) to implement more complex functions. For example, metal mask sets may be placed over two or more of the generic pre-diffused regions 102 to form a relocatable multi-slot function 108. The multi-slot function 108 may be described as a relocatable function. The term relocatable is used as a general term to indicate that the function may be located (or configured) in a number of locations around the slice 100. While the final result would be that the function 108 would be located in different locations, different pre-diffused regions 102 would be used to implement the function 108 in the different locations. Also, one or more of the functions 108 may be implemented throughout the plurality of regions 102. The multi-slot function 108 may be configured to provide mixed-signal functions using metal programmability.

In general, the present invention allows mixed-signal functions to be constructed without any special diffused circuitry, special process options, and/or additional wafer cost. Mixed-signal functions implemented with the multi-slot functions 108 may be located on any I/O slot 102 boundary. Because the multi-slot relocatable functions 108 can be located on any I/O slot 102 boundary, the present invention may provide a flexible pinout. Some examples of mixed-signal functions that may be implemented as multi-slot relocatable functions 108 may be summarized in the following TABLE 2:

TABLE 2

| Circuit | # of Slots | Applications | Function |
|---|---|---|---|
| PLL/DLL (500 MHz range or less | 5-6 | Clock multipliers, clock-data deskew | Clock generation |
| Temperature Sensor (+/-10-15 degree C. accuracy) | 2-3 | Cabinet design, package selection verification, system testing, reliability verification | Provides digital output proportional to die temperature |
| Voltage regulator | 1-2 | Any product that employs dual voltages | Generates 1.2 V, 1.8 V, or 2.5 V supply from 2.5 V or 3.3 V supply. May use external pass device. |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |

TABLE 2-continued

| Circuit | # of Slots | Applications | Function |
|---|---|---|---|
| 8-bit, 10 Msps DAC | 2-3 | Motion control, process control, Tape/disc servos, digital trimming | Actuation and control |
| 32 KHz-50 MHz Crystal Oscillator | 2 | Any application where a system clock is not always available: MP3 players, digital cameras, wireless devices, fish finders, featurized phones, circuit breakers | Generates a clock at a specified frequency set by the crystal |
| Filter (SC, CT) | 1-5 | Tape read-channels, voice encoders, instrumentation, circuit breakers | Conditions as analog signals |

However, other building blocks (or circuits) may be implemented accordingly to accomplish custom analog functions. For example, other building blocks may include, but are not limited to, operational amplifiers, comparators, analog multiplexers, analog switches, voltage/current reference. The region 106 may also be used to implement sub-functions of mixed-signal functions (e.g., switched capacitor filters, gm/C filters, data converters, etc.).

In one example, the multi-slot relocatable function 108 may be built using one or more metal mask sets. The metal mask sets may be placed over two or more of the generic pre-diffused regions 102. The metal mask sets may be configured to form two or more sub-functions of the relocatable function 108. The multi-slot relocatable functions in accordance with the present invention generally allow mixed-signal type or very sophisticated I/O functions to be defined and placed in the pre-diffused I/O slots 102.

Figure 2:
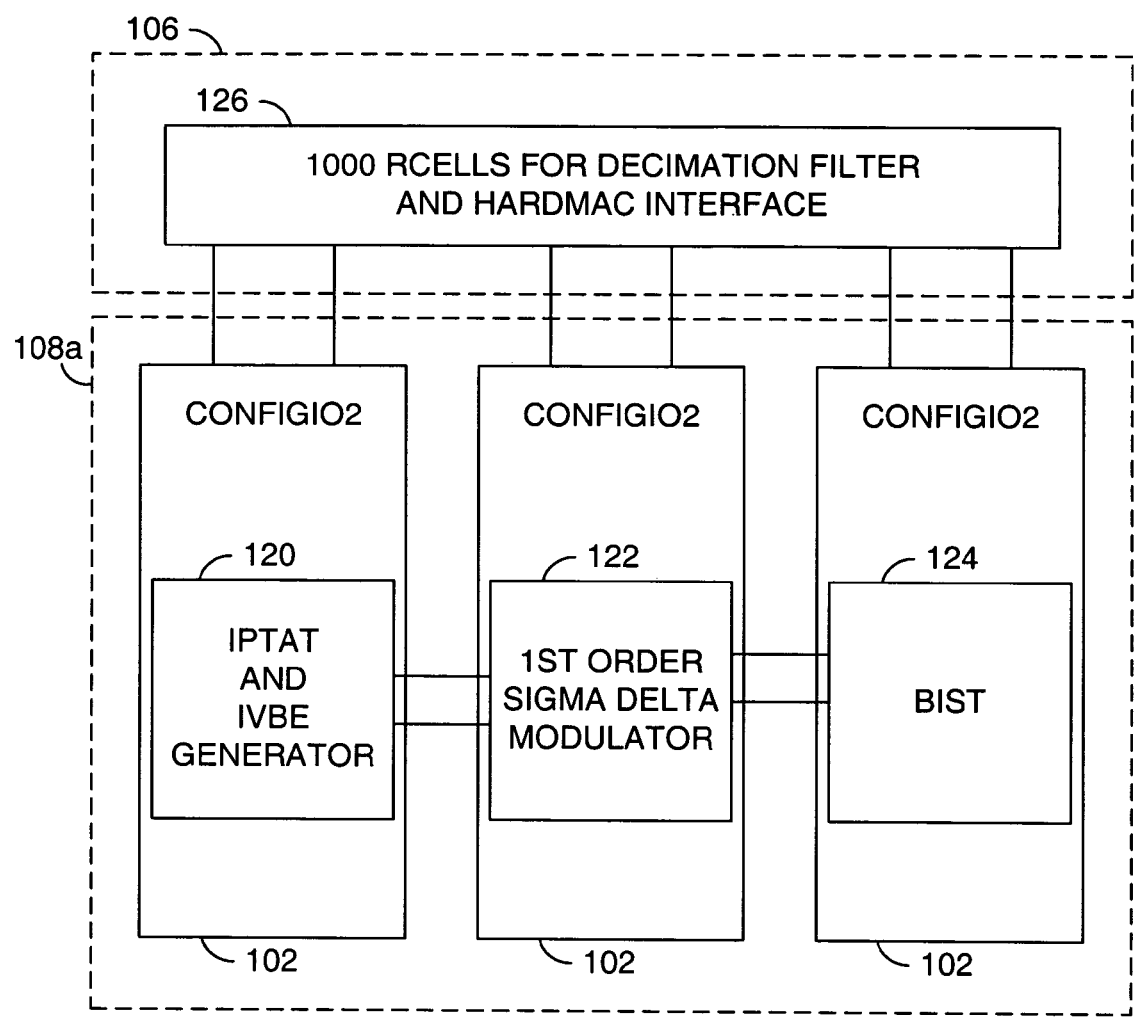
FIG. 2 is a block diagram illustrating a relocatable temperature sensing function in accordance with a preferred embodiment of the present invention.

Referring to FIG. 2, a block diagram is shown illustrating an example multi-slot relocatable function implemented in accordance with a preferred embodiment of the present invention. In one example, a temperature sensor function may be implemented with a multi-slot relocatable function 108a comprising three of the regions 102 and a portion of the region 106. For example, the multi-slot relocatable temperature sensor function may comprise a sub-function 120, a sub-function 122, a sub-function 124 and sub-function 126. The sub-functions 120 to 126 of the multi-slot relocatable function 108a may be implemented with one or more metal mask sets configured to customize one or more respective regions 102 and/or a portion of the region 106.

In one example, the sub-function 120 may comprise a proportional to absolute temperature current (IPTAT) generator and a band-gap current (IVBE) generator. The sub-function 122 may comprise a first order sigma delta modulator. The sub-function 124 may comprise a built-in self test (BIST) circuit. The sub-function 126 may comprise a decimation filter and hardmac interface. The sub-function 126 may be implemented using a portion of the region 106 (e.g., using approximately 1,000 R-cells). In general, the layout of the sub-functions may be such that supply bus overlap is minimized. Minimizing supply bus overlap may reduce power supply coupling. The sub-functions 120, 122 and 124 may be configured such that interconnections between the sub-functions may be run (or routed) in a single layer. In one example, the interconnections may be routed straight and orthogonal (or perpendicular) with respect to the sub-functions. Straight, orthogonal interconnections may minimize or reduce parasitics. In one example, the interconnections may be aligned with a single axis (e.g., a horizontal axis) of the slice 100.

Figure 3:
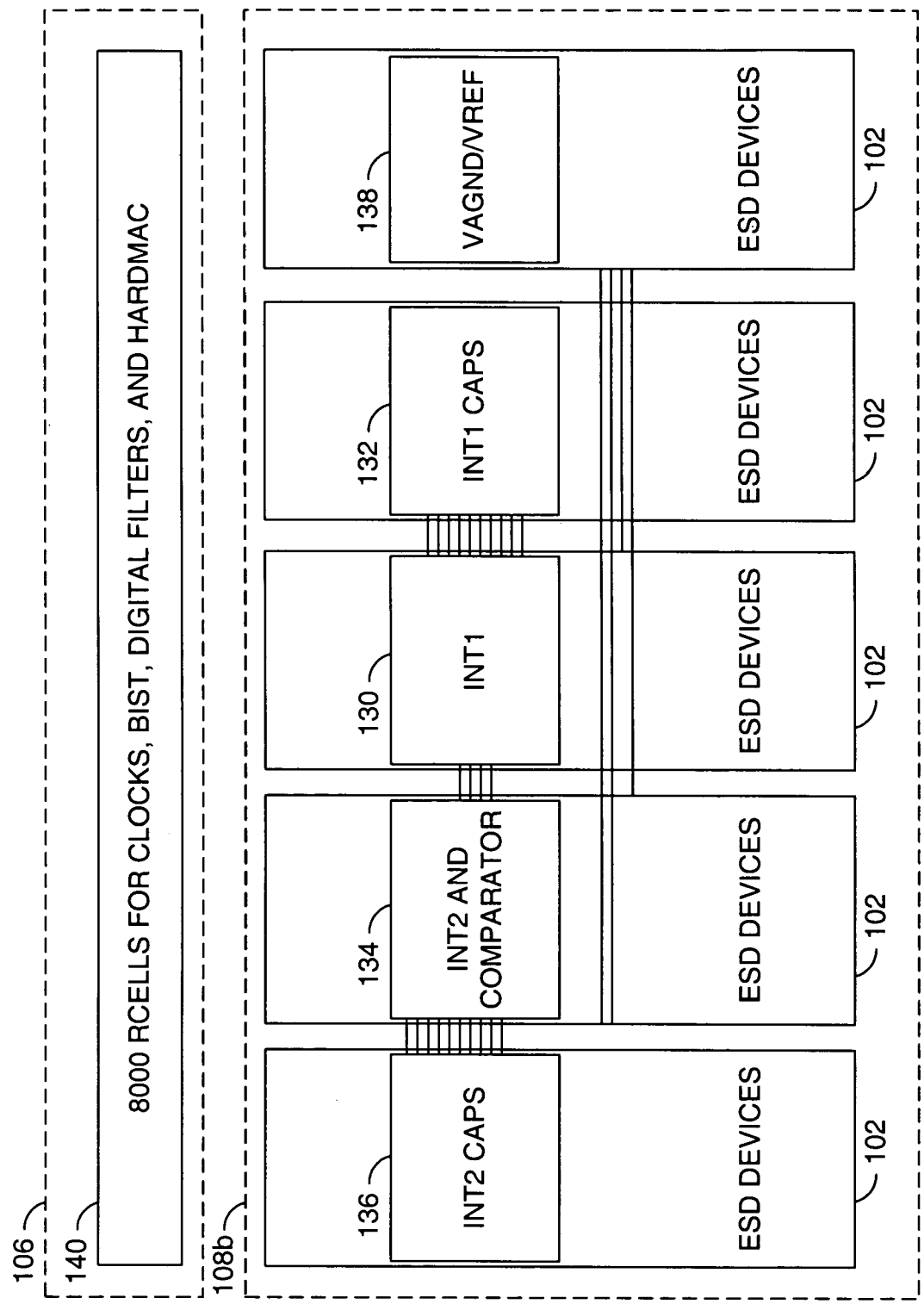
FIG. 3 is a block diagram illustrating a relocatable analog-to-digital convertor (ADC) function in accordance with a preferred embodiment of the present invention.

Referring to FIG. 3, a block diagram is shown illustrating another example multi-slot relocatable mixed-signal function implemented in accordance with another preferred embodiment of the present invention. In one example, an analog-to-digital converter (ADC) may be implemented comprising a multi-slot relocatable function 108b. The multi-slot relocatable ADC function may comprise a sub-function 130, a sub-function 132, a sub-function 134, a sub-function 136, a sub-function 138, and a sub-function 140. The sub-functions 130 to 140 of the multi-slot relocatable mixed-signal function may be implemented with one or more metal mask sets configured to customize one or more respective regions 102 of the multi-slot function 108b and/or a portion of the region 106.

In one example, the sub-function 130 may comprise a first integrator (e.g., INT1). The sub-function 132 may comprise one or more capacitors for the first integrator INT1 sub-function 130. The sub-function 134 may comprise a second integrator (e.g., INT2) and a comparator functions. The subfunction 136 may comprise one or more capacitors for the second integrator INT2 sub-function 134. The sub-function 138 may implement an analog supply ground (e.g., VAGND) and reference voltage (e.g., VREF). The sub-function 140 may comprise circuitry for clocks, built-in self test (BIST), digital filters and hardmac interfacing. In one example, the sub-function 140 may be implemented using R-cells (e.g., approximately 8000 R-cells) in a portion of the region 106.

In one example, the capacitors for the first integrator INT1 and the second integrator INT2 may be implemented in metal layers of a device implemented with the slice 100 (e.g., in second and third layers, third and fourth layers, second and fourth layers, etc.). In general, the capacitors are not placed under I/O or core power busses for noise isolation. In general, capacitors with a capacitance of less than four picofarad (pF) may be implemented in each of the integrators. The integrator capacitors and the analog ground and voltage reference generally act as pin isolation. In one example, bias voltages and currents may be routed in the second metal layer under I/O power busses with shielding provided by a third metal layer. Electrostatic discharge (ESD) devices may also be implemented in each of the regions 102. In general, the ESD devices may be placed under I/O power busses.

Figure 4:
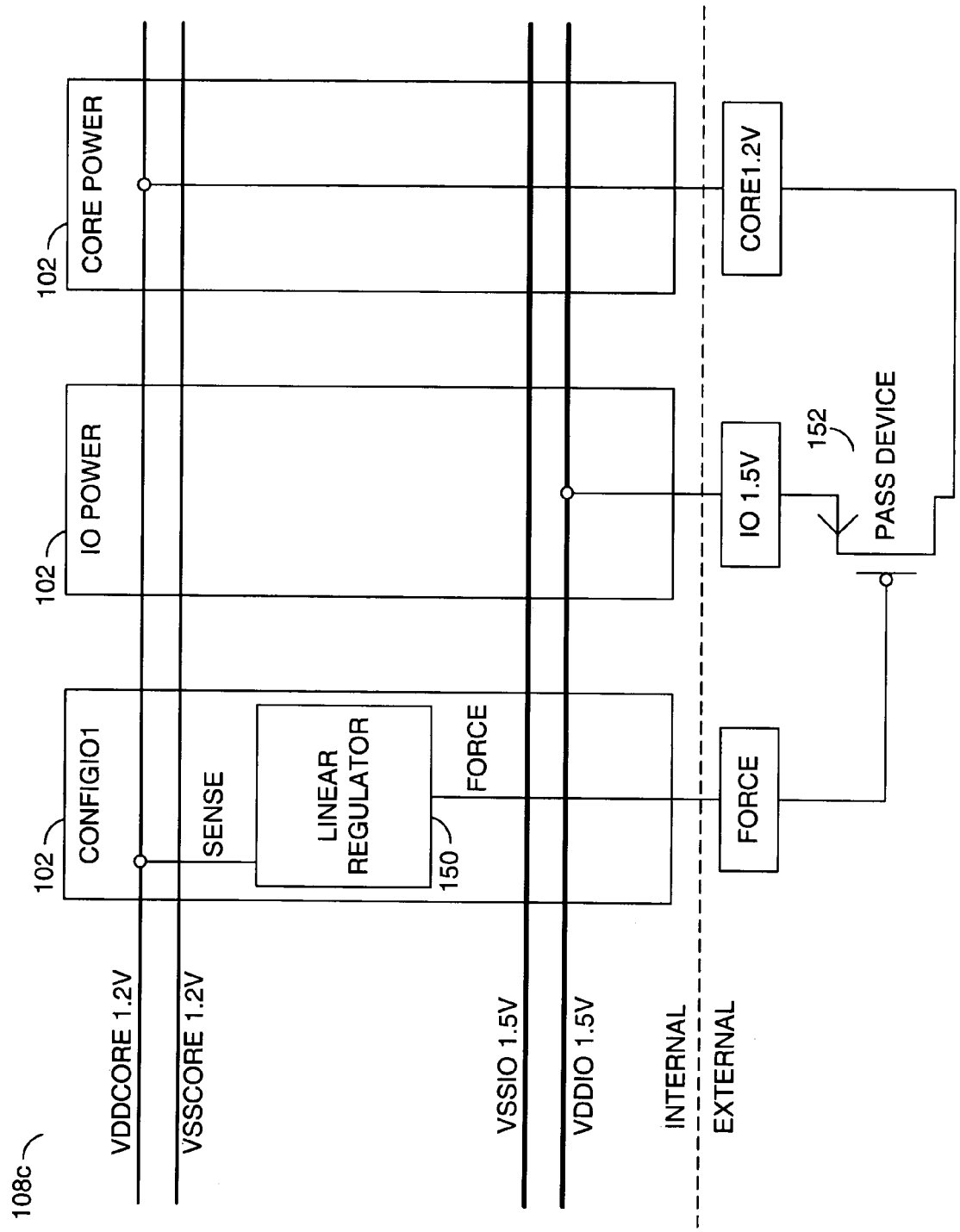
FIG. 4 is a block diagram illustrating a relocatable linear regulator function in accordance with a preferred embodiment of the present invention.

Referring to FIG. 4, a block diagram is shown illustrating another example multi-slot relocatable function implemented in accordance with another preferred embodiment of the present invention. In another example, a multi-slot relocatable function 108c may be configured to implement a voltage regulator function. The voltage regulator function may be configured to use an off-chip pass device. In one example, the voltage regulator using an off-chip pass device may be implemented using three of the regions 102. For example, the multi-slot relocatable function 108c may comprise a linear regulator 150 implemented in a first region 102. A second region 102 may be configured to present an external supply voltage (e.g., IO) to an internal I/O supply voltage bus (e.g., VDDIO). A third region 102 may be configured to present an external supply voltage (e.g., CORE) to an internal core voltage supply bus (e.g., VDDCORE). In one example, the supply voltage IO may be 1.5V and the supply voltage CORE may be 1.2V.

An output from the first region 102 may be presented to a gate of an external pass device 152. In one example, the external pass device 152 may be implemented as one or more metal oxide semiconductor field effect transistors (MOSFETs). However, other types and/or polarities of transistors may be implemented accordingly to meet the design criteria of a particular implementation. A source of the external pass device 152 may be connected to receive the supply voltage IO. A drain of the external pass device 152 may be connected to present the supply voltage CORE. The linear regulator 150 may have an input (e.g., SENSE) that may be coupled to the internal core supply voltage bus and an output that may present a signal (e.g., FORCE). The signal FORCE may be implemented as a control signal. The signal FORCE may be presented to the gate of the external pass device 152. The linear regulator 150 may be configured to sense and control a voltage level of the internal core supply voltage bus VDDCORE using the external pass device 152. In one example, the multi-slot function 108c may be configured to generate a core voltage of 1.2 volts using an IO voltage supply of 1.5 volts. However, other voltage levels may be implemented accordingly to meet the design criteria of a particular implementation.

Figure 5:
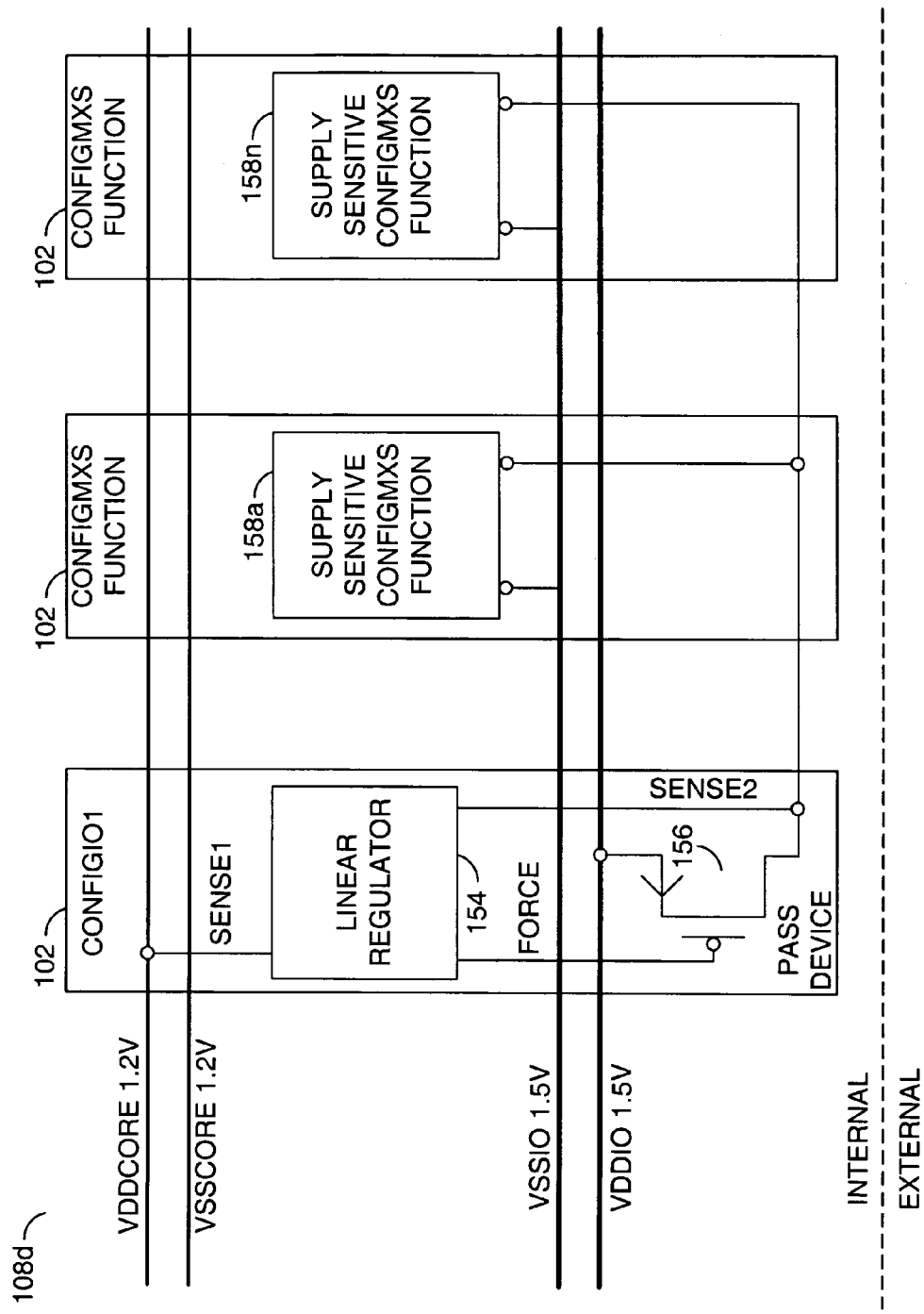
FIG. 5 is a block diagram illustrating another relocatable linear regulator function in accordance with a preferred embodiment of the present invention.

Referring to FIG. 5, a block diagram is shown illustrating another relocatable linear regulator function in accordance with a preferred embodiment of the present invention. In another example, a multi-slot relocatable mixed-signal function 108d may be implemented comprising a linear regulator 154, a pass device 156 and one or more supply sensitive mixed-signal (MXS) functions 158a-n. The relocatable mixed-signal function 108d may be configured to implement a voltage regulator using an on-chip pass device. The voltage regulator 154 may be implemented similarly to the regulator 150 in FIG. 4 except that the on-chip pass device 156 may be implemented as part of the regulator sub-function. In one example, a supply voltage for the functions 158a-n may be provided by the internal pass device 156 and a supply ground may be provided by an I/O supply ground (e.g., VSSIO).

An output from the regulator 154 may present a signal (e.g., FORCE) to a base of the internal pass device 156. In one example, the internal pass device 156 may be implemented as one or more metal oxide semiconductor field effect transistors (MOSFET). However, other transistor types and numbers available in the region 102 may be configured accordingly to meet the design criteria of a particular implementation. A source of the internal pass device 156 may be connected to receive an I/O supply voltage (e.g., VDDIO). A drain of the internal pass device 156 may be connected (or routed) to the supply sensitive functions 158a-n. The linear regulator 154 may have a first input (e.g., SENSE1) that may be coupled to an internal core supply voltage bus (e.g., VDDCORE) and a second input (e.g., SENSE2) that may be coupled to the drain of the pass device 156. In another example, the input SENSE2 may be routed to monitor the voltage at the supply sensitive functions 158a-n.

The linear regulator 154 may be configured to sense and control a voltage level presented to the supply sensitive functions 158a-n based on the internal core supply voltage bus using the internal pass device 156. In one example, the regulator 154 may be configured to generate a voltage of 1.2 volts using an IO voltage supply of 1.5 volts. However, other voltage levels may be implemented accordingly to meet the design criteria of a particular implementation.

Figure 6:
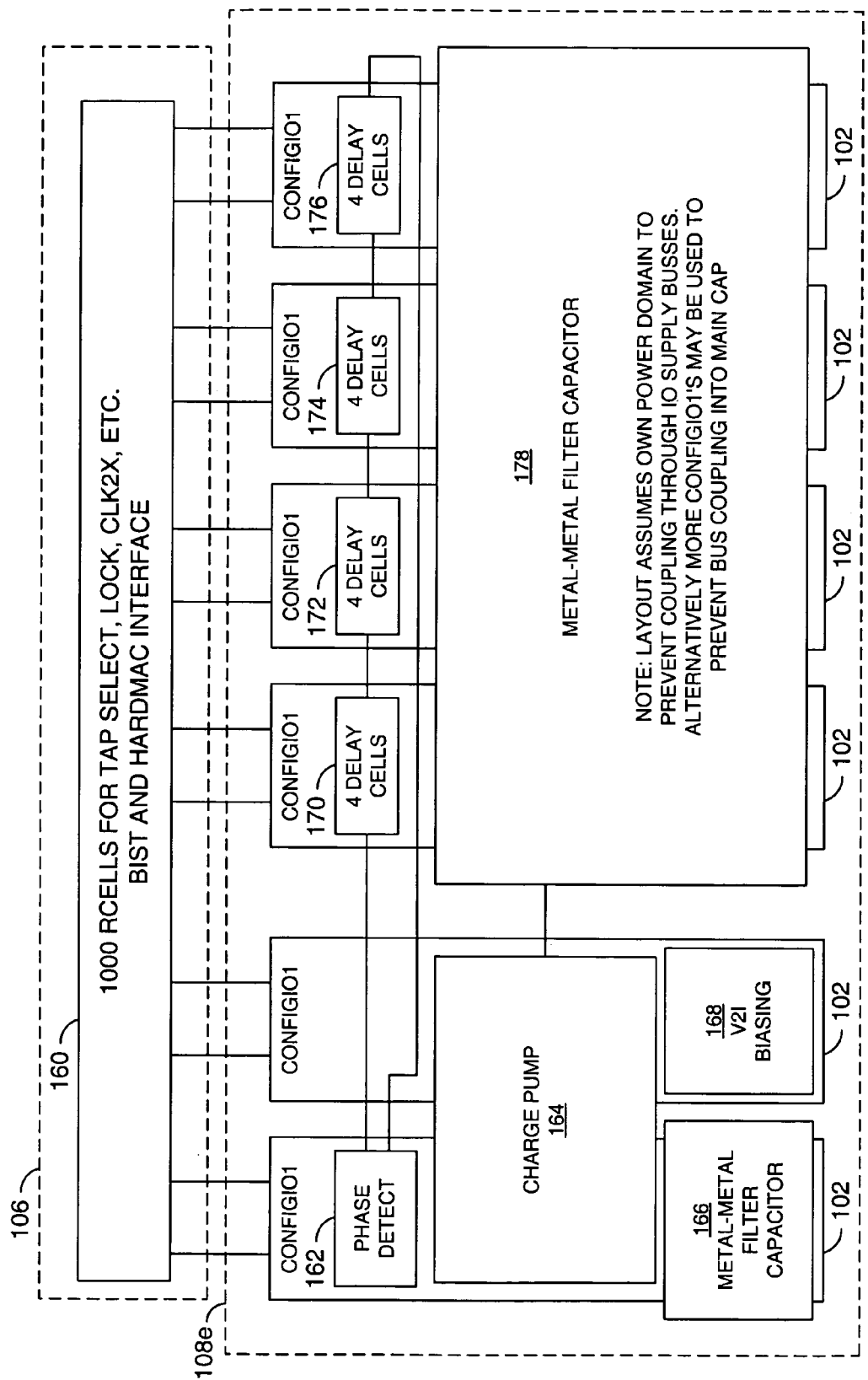
FIG. 6 is a block diagram illustrating a relocatable delay locked loop (DLL) function in accordance with a preferred embodiment of the present invention.

Referring to FIG. 6, a block diagram is shown illustrating a relocatable delay locked loop (DLL) function in accordance with a preferred embodiment of the present invention. The relocatable delay locked loop function may comprise (i) a multi-slot relocatable mixed-signal function 108e implemented over a number of regions 102 and (ii) a sub-function 160 that may be implemented, in one example, using R-cells in a portion of the region 106. The multi-slot relocatable mixed-signal function 108e may comprise a sub-function 162, a sub-function 164, a sub-function 166, a sub-function 168, a sub-function 170, a sub-function 172, a sub-function 174, a sub-function 176 and a sub-function 178. The sub-functions 160-178 may be implemented with one or more metal mask sets configured to customize one or more respective regions 102 and/or a portion of the region 106.

In one example, the sub-function 160 may comprise circuitry for tap selection, lock detection, clock generation, built-in self-test (BIST) and hardmac interfacing. The sub-function 160 may be implemented using a portion of the R-cells (e.g., approximately 1,000 R-cells) in the region 106.

The sub-function 162 may comprise a phase detection circuit (or block). The sub-function 164 may comprise a charge pump. The sub-function 166 may comprise a metal-metal filter capacitor. The sub-function 168 may comprise a voltage-to-current (V2I) biasing circuit (or block). The sub-functions 170-176 each may comprise a number of delay cells. In one example, each of the sub-functions 170-176 may be implemented with four delay cells. The sub-function 178 may comprise a metal-metal filter capacitor. In general, the layout of the multi-slot relocatable mixed-signal function 108e may be implemented with a local power domain to prevent coupling through I/O supply busses. Alternatively, additional regions 102 may be configured to prevent bus coupling into the main capacitor. In one example, the sub-function 162-168 may be implemented using two of the regions 102. Each of the sub-functions 170-176 may be implemented in a portion of a respective region 102. The sub-function 178 may be implemented across a number of regions 102.

Figure 7:
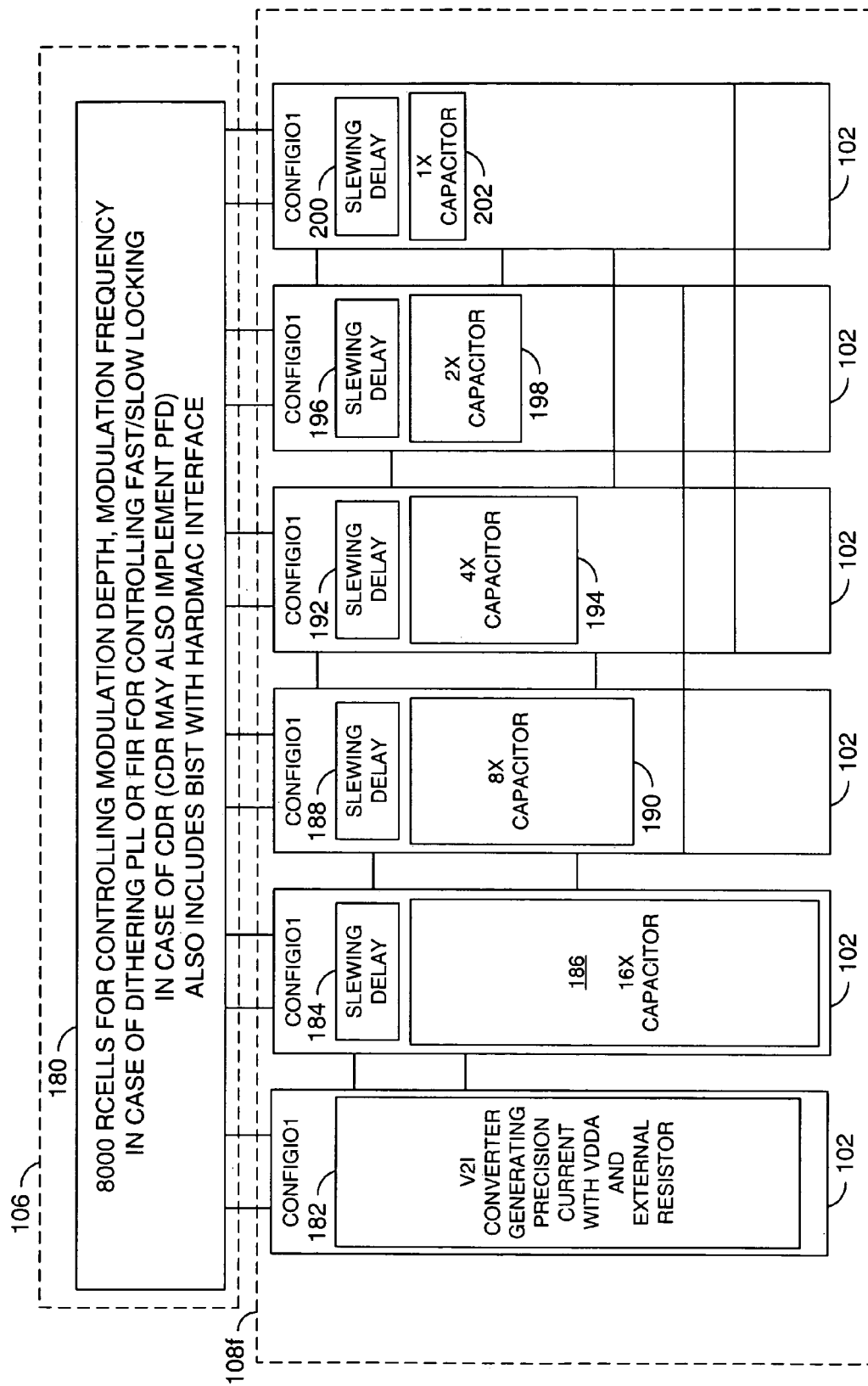
FIG. 7 is a block diagram illustrating a relocatable phase interpolator function in accordance with a preferred embodiment of the present invention.

Referring to FIG. 7, a block diagram is shown illustrating a relocatable phase interpolator function in accordance with a preferred embodiment of the present invention. The relocatable phase interpolator function may comprise a sub-function 180, a sub-function 182, a sub-function 184, a sub-function 186, a sub-function 188, a sub-function 190, a sub-function 192, a sub-function 194, a sub-function 196, a sub-function 198, a sub-function 200 and a sub-function 202. The sub-function 180 may be implemented in a portion of the region 106. In one example, the sub-function 180 may be configured to control modulation depth, modulation frequency (e.g., in the case of a dithering PLL) or finite impulse response (FIR) circuitry for controlling fast/slow locking in the case of clock data recovery (CDR). For example, CDR may also implement a phase frequency detector (PFD). The region 180 may also implement built-in self-test (BIST) and hardmac interface circuitry. In one example, the sub-function 180 may be implemented using 8,000 R-cells of the region 106.

The sub-functions 182-202 may be implemented as part of a multi-slot relocatable mixed-signal function 108f. In one example, the multi-slot function 108f may be implemented using six of the regions 102. For example, the sub-function 182 may be implemented in a single region 102. The sub-function 182 may comprise a voltage-to-current (V2I) converter configured to generate a precision current with an analog supply voltage (e.g., VDDA) and an external resistor. The sub-functions 184 and 186 may be implemented together in a single region 102. The sub-functions 188 and 190 may be implemented together in a single region 102. The sub-functions 192 and 194 may be implemented together in a single region 102. The sub-functions 196 and 198 may be implemented together in a single region 102. The sub-functions 200 and 202 may be implemented together in a single region 102. The sub-functions 184, 188, 192, 196 and 200 may each be implemented as a slewing delay circuit (or block). The sub-functions 186, 190, 194, 198 and 202 may each be implemented as capacitors. In one example, the sub-functions 186, 190, 194, 198 and 202 may have a binary scaled respective size (e.g., 16×, 8×, 4×, 2×, 1× respectively). In general, the layout of the multi-slot relocatable mixed-signal function 108f may be configured to share an isolated supply with the DLL of FIG. 6. Interconnection may be implemented between a number of the regions 102 and/or between the region 106 and the regions 102. For example, routing may be implemented in the region 106.

Figure 8:
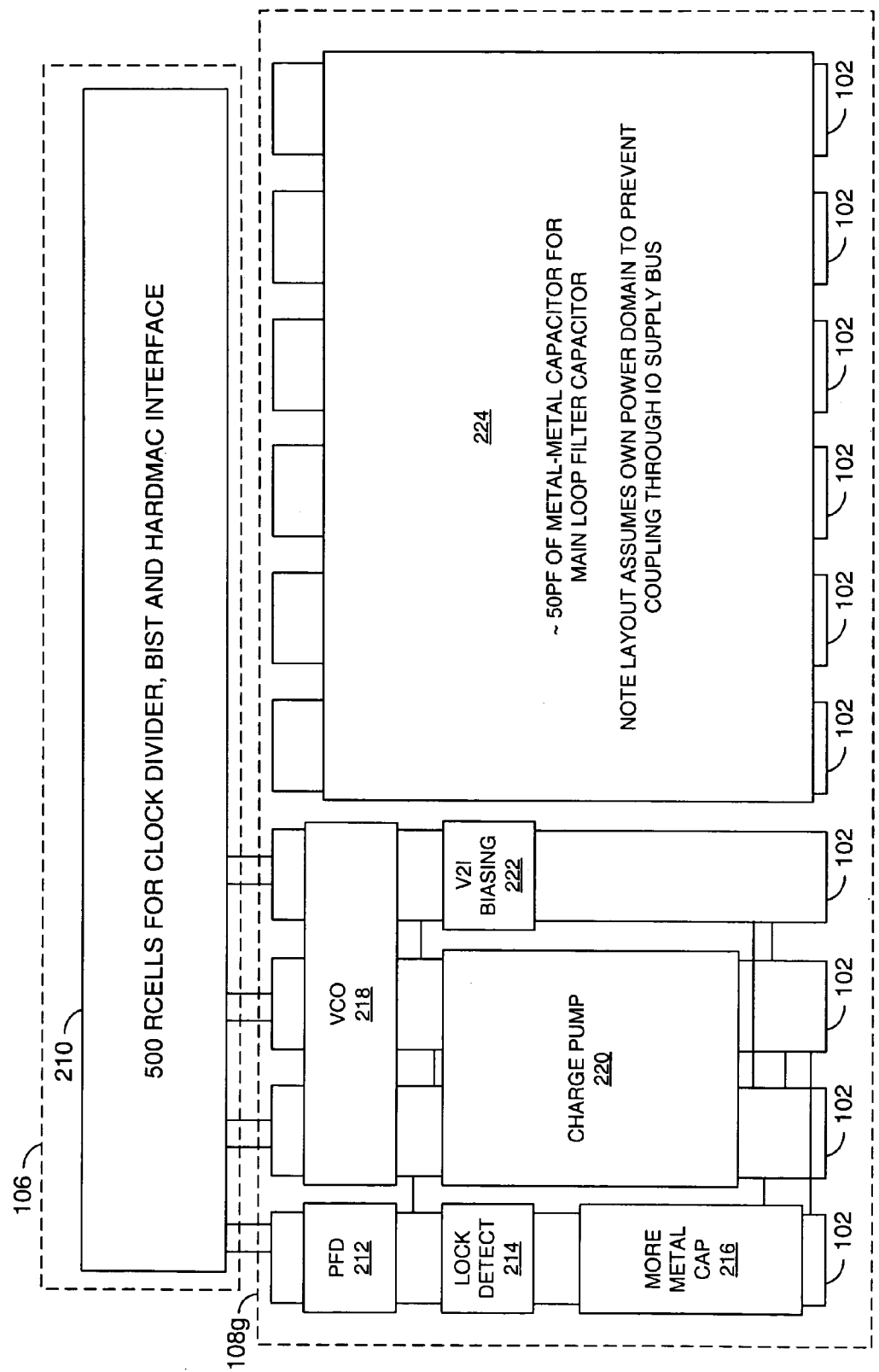
FIG. 8 is a block diagram illustrating a relocatable phase locked loop (PLL) function in accordance with a preferred embodiment of the present invention.

Referring to FIG. 8, a block diagram is shown illustrating a relocatable phase locked loop (PLL) function in accordance with a preferred embodiment of the present invention. The relocatable phase locked loop function may comprise a sub-function 210 implemented using a portion of the region 106 and a multi-slot relocatable function 108g. In one example, the sub-function 210 may be implemented using 500 R-cells of the region 106. The sub-function 210 may be configured to provide a clock divider, built-in self-test (BIST) and hardmac interface circuitry.

The multi-slot function 108g may comprise a number of sub-functions (or blocks) 212-224. The sub-functions 212-224 may be implemented, in one example, using ten of the regions 102. For example, the sub-function 212, 214 and 216 may be implemented in a single region 102. The sub-function 212 may comprise a phase frequency detector (PFD). The sub-function 214 may comprise a lock detect circuit (or block). The sub-function 216 may comprise a metal-metal capacitor. The sub-functions 218, 220 and 222 may be implemented using three of the regions 102. For example, the sub-function 218 may comprise a voltage control oscillator (VCO) implemented across the three regions 102. The sub-function 220 may comprise a charge pump implemented across two of the three regions 102. The sub-function 222 may comprise a voltage-to-current (V2I) biasing circuit (or block). The sub-function 224 may be implemented, in one example, using six of the regions 102. The sub-function 224 may comprise a metal-to-metal capacitor configured as a main loop filter capacitor. In one example, the sub-function 224 may provide approximately 50 picofarads (pF) of capacitance. In general, the layout of the multi-slot relocatable function 108g may implement a separate power domain to prevent coupling through I/O supply busses.

Routing may be implemented between the region 106 (e.g., the R-cells) and each of the regions 102 containing the VCO 218 and the PFD 212. In general, each block may have a route to a nearby block such that all of the blocks have a connection directly to or through the other blocks.

In general, those skilled in the field or fields relevant to each of the embodiments of the present invention would be able to implement each of the sub-functions illustrated in the block diagrams of FIGS. 2-8 based on the present disclosure. Therefore, one reasonably skilled in the art would be able to make and use the present invention from the present disclosure coupled with information known in the art without undue experimentation.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a base layer of a platform application specific integrated circuit (ASIC) comprising a plurality of pre-diffused regions disposed around a periphery of said platform ASIC, wherein each of said plurality of pre-diffused regions is metal-programmable as a configurable input/output (I/O) slot of said platform ASIC; and
    a mixed-signal function comprising two or more sub-functions formed with a metal mask set placed over a number of said plurality of pre-diffused regions, wherein said metal mask set customizes the number of pre-diffused regions as said two or more sub-functions instead of configurable I/O slots.

2. The apparatus according to claim 1, further comprising an R-cell transistor fabric customizable by said metal mask set.

3. The apparatus according to claim 1, wherein said metal mask set configures said pre-diffused regions of said platform ASIC as a function selected from the group consisting of (i) an operational amplifier, (ii) a comparator, (iii) an analog multiplexer, (iv) an analog switch, (v) a voltage/current reference, (vi) a phase locked loop (PLL), (vii) a delay lock loop (DLL), (viii) a temperature sensor, (ix) a regulator, (x) an analog-to-digital converter (ADCs), (xi) a digital-to-analog converter (DAC), (xii) an oscillator and (xiii) a filter.

4. The apparatus according to claim 1, wherein each of said pre-diffused regions comprises a number of transistor types.

5. The apparatus according to claim 4, wherein said number of transistor types are metal programmable.

6. The apparatus according to claim 1, wherein said metal mask set is further configured to define one or more metal-metal capacitors.

7. The apparatus according to claim 1, wherein said metal mask set defines a mixed-signal function that can be placed on any input/output (I/O) slot boundary of said platform ASIC.

8. The apparatus according to claim 1, wherein said platform ASIC further comprises a programmable R-cell transistor fabric.

9. The apparatus according to claim 1, wherein said. mixed-signal function is configured to operate with analog and digital signals.

10. An apparatus comprising:
    means for forming a base layer of a platform application specific integrated circuit (ASIC) comprising a plurality of pre-diffused regions disposed around a periphery of said platform ASIC, wherein each of said plurality of pre-diffused regions is metal-programmable as a configurable input/output (I/O) slot of said platform ASIC; and
    means for forming two or more sub-functions of a mixed-signal function from a number of said plurality of pre-diffused regions, wherein said metal mask set customizes the number of pre-diffused regions as said two or more sub-functions instead of configurable I/O slots.

11. A method for implementing relocatable mixed-signal functions comprising the steps of:
    (A) forming a base layer of a platform application specific integrated circuit (ASIC) comprising a plurality of pre-diffused regions disposed around a periphery of said platform ASIC, wherein each of said plurality of pre-diffused regions is metal-programmable as a configurable input/output (I/O) slot of said platform ASIC; and (B) forming two or more sub-functions of a mixed-signal function from a number of said plurality of pre-diffused regions using a metal mask set, wherein said metal mask set customizes the number of pre-diffused regions as said two or more sub-functions instead of configurable I/O slots.

12. The method according to claim 11, further comprising the step of:

customizing a portion of an R-cell transistor, fabric of said platform ASIC with said metal mask set.

13. The method according to claim 11, wherein said metal mask set configures said pre-diffused regions of said platform ASIC as a function selected from the group consisting of (i) an operational amplifier, (ii) a comparator, (iii) an analog multiplexer, (iv) an analog switch, (v) a voltage/current reference, (vi) a phase locked loop (PLL), (vii) a delay lock loop (DLL), (viii) a temperature sensor, (ix) a regulator, (x) an analog-to-digital converter (ADC), (xi) a digital-to-analog converter (DAC), (xii) an oscillator and (xiii) a filter.

14. The method according to claim 11, wherein each of said pre-diffused regions comprises a plurality of transistor types.

15. The method according to claim 14, wherein said plurality of transistor types are metal programmable.

16. The method according to claim 11, wherein said metal mask set is further configured to define one or more metal-metal capacitors.

17. The method according to claim 11, wherein said metal mask set defines a mixed-signal function that can be located at any input/output (I/O) slot boundary of said platform ASIC.

18. The method according to claim 11, wherein said base layer further comprises a programmable R-cell transistor fabric.

19. The method according to claim 11, wherein said mixed-signal function is configured to operate with analog and digital signals.

20. A method for implementing relocatable mixed-signal, functions comprising the steps of:

(A) forming a base layer of a platform application specific integrated circuit (ASIC) comprising a plurality of pre-diffused regions disposed around a periphery of said platform ASIC, wherein each of said pre-diffused regions is configured to be metal-programmable; and (B) forming two or more sub-functions of a mixed-signal function from a number of said plurality of pre-diffused regions using a metal mask set, wherein said metal mask set configures said pre-diffused regions of said platform ASIC as a function selected from the group consisting of (i) an operational amplifier, (ii) a comparator, (iii) an analog multiplexer, (iv) an analog switch, (v) a voltage/current reference, (vi) a phase locked loop (PLL), (vii) a delay lock loop (DLL), (viii) a temperature sensor, (ix) a regulator, (x) an analog-to-digital converter (ADC), (xi) a digital-to-analog converter (DAC), (xii) an oscillator and (xiii) a filter.

* * * * *